(12) United States Patent
Lee et al.

(10) Patent No.: US 7,414,441 B2
(45) Date of Patent: Aug. 19, 2008

(54) OUTPUT BUFFER CIRCUIT

(75) Inventors: Youn Joong Lee, Seoul (KR); Won Tae Choi, Yongin (KR); Chan Woo Park, Ansan (KR); Byung Hoon Kim, Seoul (KR)

(73) Assignee: Samsung Electro-Mechanics Co., Ltd., Suwon-si, Gyunggi-do (KR)

( * ) Notice: Subject to any disclaimer, the term of this patent is extended or adjusted under 35 U.S.C. 154(b) by 68 days.

(21) Appl. No.: 11/422,568

(22) Filed: Jun. 6, 2006

(65) Prior Publication Data

US 2007/0008020 A1    Jan. 11, 2007

(30) Foreign Application Priority Data

Jul. 11, 2005    (KR) ...................... 10-2005-0062053

(51) Int. Cl.
    *H03K 3/00*    (2006.01)
(52) U.S. Cl. ...................... 327/108; 327/560; 327/561; 327/562; 327/563; 330/252; 330/253
(58) Field of Classification Search .................. 327/261, 327/262, 323, 306, 307, 336, 362, 378, 379, 327/108, 560–563, 252, 253; 330/252–253
    See application file for complete search history.

(56) References Cited

U.S. PATENT DOCUMENTS

| | | | |
|---|---|---|---|
| 4,597,961 A | 7/1986 | Etscorn | 424/28 |
| 4,704,406 A | 11/1987 | Stanislaus et al. | 514/570 |
| 4,832,953 A | 5/1989 | Campbell et al. | 424/448 |
| 5,230,896 A | 7/1993 | Yeh et al. | 424/443 |
| 5,278,176 A | 1/1994 | Lin | 514/343 |
| 5,580,574 A | 12/1996 | Behl et al. | 424/449 |
| 5,603,947 A | 2/1997 | Wong et al. | 424/448 |
| 5,633,008 A | 5/1997 | Osborne et al. | 424/448 |
| 5,658,587 A | 8/1997 | Santus et al. | 424/448 |
| 5,662,890 A | 9/1997 | Punto et al. | 424/59 |
| 5,783,207 A | 7/1998 | Stanley et al. | 424/440 |
| 5,891,462 A | 4/1999 | Carrara | 424/449 |
| 5,932,243 A | 8/1999 | Fricker et al. | 424/450 |
| 5,935,604 A | 8/1999 | Illum | 424/501 |
| 6,034,079 A | 3/2000 | Sanberg et al. | 514/225.8 |

(Continued)

FOREIGN PATENT DOCUMENTS

| | | |
|---|---|---|
| JP | 2003-168936 A | 6/2006 |
| KR | 1998-021251 A | 6/1998 |
| KR | 10-0357319 B1 | 10/2002 |

*Primary Examiner*—Kenneth B. Wells
*Assistant Examiner*—Brandon S Cole
(74) *Attorney, Agent, or Firm*—Lowe Hauptman Ham & Berner

(57) ABSTRACT

An output buffer circuit includes an input stage of which one end receives an input voltage and the other end receives an output voltage; a class AB output stage that increases a current flowing in the output stage when the difference between the input and output voltages is larger than 0; a floating current source that biases the class AB output stage; a summing circuit that is connected to the input stage, the floating current source, and the class AB output stage so as to sum up the current supplied from the input stage and the internal current supplied from the floating current source; and an offset compensating circuit that is connected to the input stage and is composed of a plurality of switching elements and resistors so as to detect an offset voltage to compensate.

13 Claims, 3 Drawing Sheets

U.S. PATENT DOCUMENTS

| | | |
|---|---|---|
| 6,165,497 A | 12/2000 | Osborne et al. ............. 424/448 |
| 6,166,044 A | 12/2000 | Sandborn et al. ............ 514/343 |
| 6,267,985 B1 | 7/2001 | Chen et al. ................. 424/451 |
| 6,299,900 B1 | 10/2001 | Reed et al. ................. 424/449 |
| 6,383,471 B1 | 5/2002 | Chen et al. .................... 424/45 |
| 6,417,205 B1 | 7/2002 | Cooke et al. ................ 514/343 |
| 6,426,078 B1 | 7/2002 | Bauer et al. ................. 424/401 |
| 6,465,005 B1 | 10/2002 | Biali et al. .................. 424/449 |
| 6,479,076 B2 | 11/2002 | Blank ......................... 424/484 |
| 6,596,740 B2 | 7/2003 | Jones ......................... 514/343 |
| 6,828,336 B2 | 12/2004 | Walling ..................... 514/343 |
| 6,911,475 B1 | 6/2005 | Cesaro et al. .............. 514/567 |
| 6,995,265 B2 | 2/2006 | Comins et al. ................ 546/14 |
| 7,029,692 B1 | 4/2006 | Bracht ........................ 424/449 |
| 2004/0219197 A1 | 11/2004 | Carrara et al. .............. 424/449 |

[FIG. 1A]
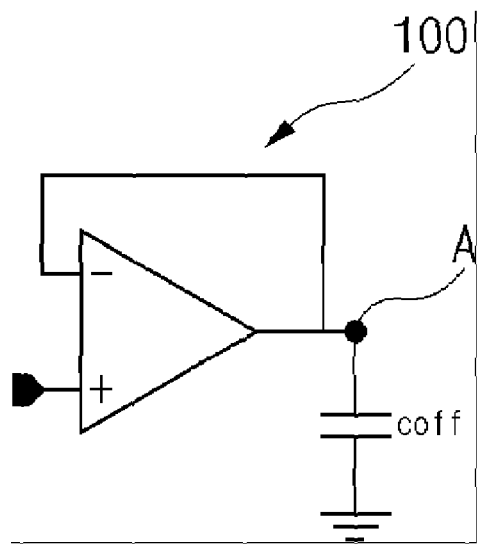
[FIG. 1B]
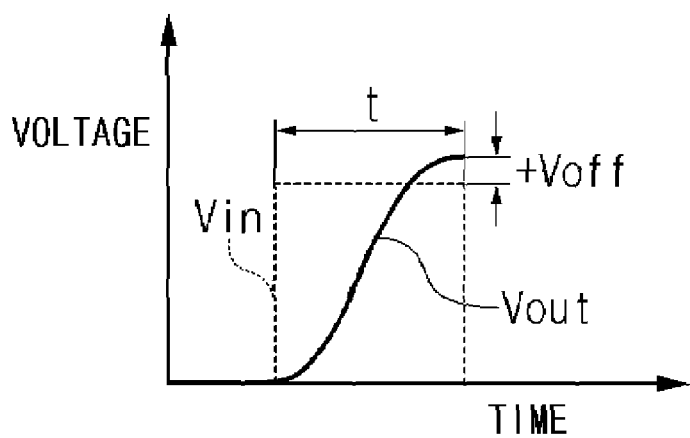
[FIG. 1C]
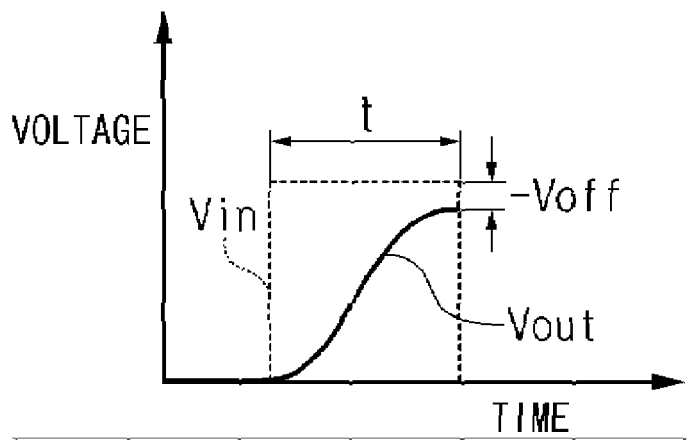

[FIG. 2]
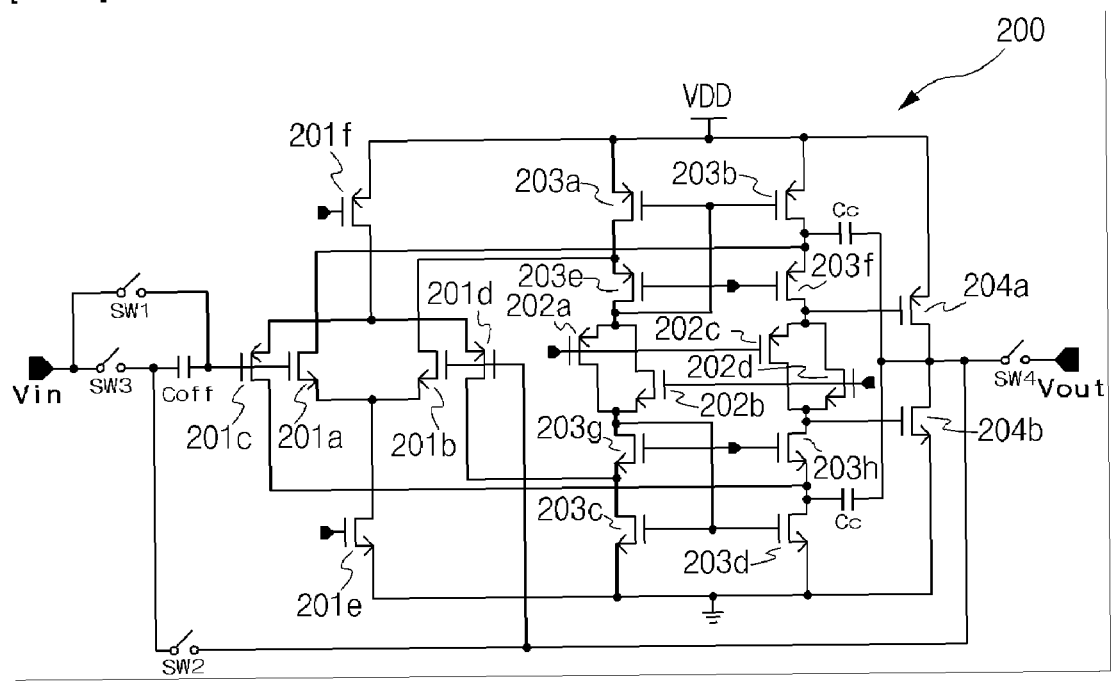
[FIG. 3]
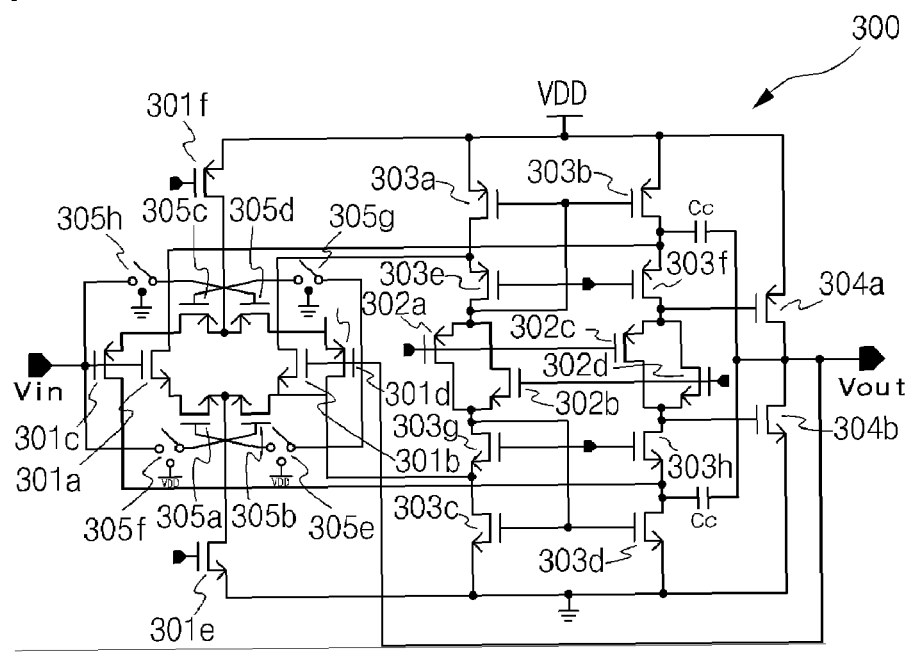

[FIG. 4A]
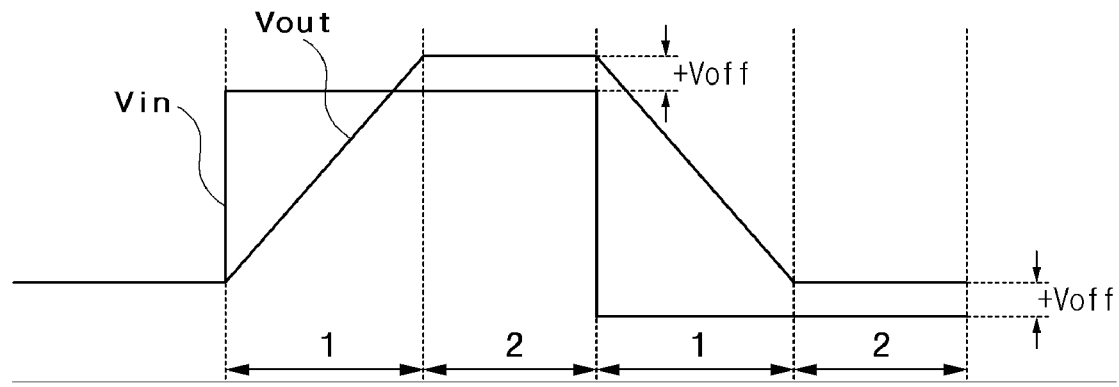
[FIG. 4B]
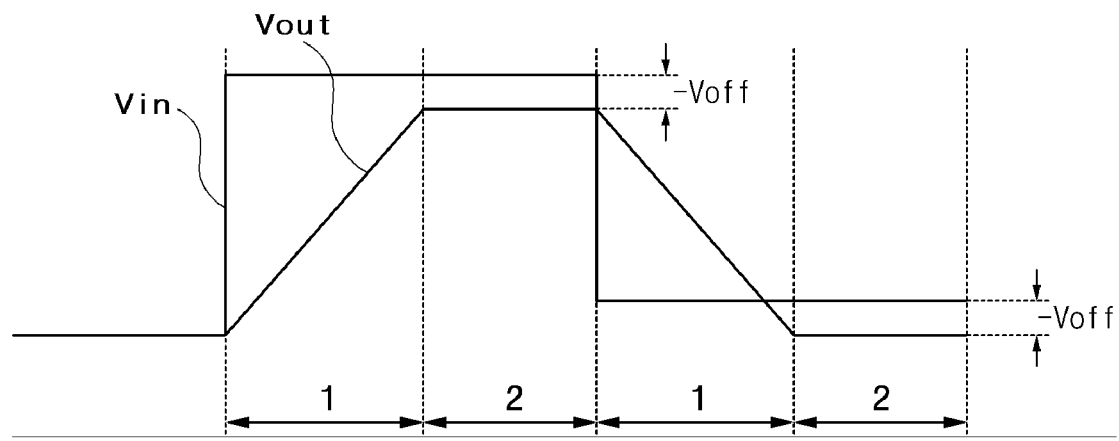

OUTPUT BUFFER CIRCUIT

CROSS-REFERENCE TO RELATED APPLICATIONS

The application claims the benefit of Korea Patent Application No. 2005-0062053 filed with the Korea Industrial Property Office on Jul. 11, 2005, the disclosure of which is incorporated herein by reference.

BACKGROUND OF THE INVENTION

1. Field of the Invention

The present invention relates to an output buffer circuit, in which the offset voltage of a data driver is detected by an offset compensating circuit composed of a small number of switching elements and resistors and is fed back to an input stage so that an output voltage becomes equal to an input voltage. Therefore, the data driver can be reduced in size, the offset voltage can be accurately compensated, and data can be transmitted at a high rate because a time for compensating the offset voltage is not required.

2. Description of the Related Art

Although the resolution of a SOM (Spatial Optical Modulator) driver IC currently stays at 8 bits, a 10-bit resolution or more will be practically used within several years.

However, in order to generate a 10-bit gradation voltage, such a data driver is needed that can output a gradation voltage of which the offset voltage (the different between input and output voltages) is in the range of less than ±1 mV, considering that the output voltage is in the range of about 4 V. Accordingly, it can be found that a data driver with a considerably high precision is needed, considering that the offset voltage of a current 8-bit data driver is in the range of ±3 mV to ±10 mV. However, if the current 8-bit data driver is used, an image signal cannot be accurately transmitted due to the influence of an offset voltage as the output resolution increases.

Therefore, in order to reduce the offset voltage of a data driver, the application of various offset compensating circuits to the data driver is attempted. For example, there are provided an auto zeroing method, a chopper stabilization method, and a ping-pong method. The auto zeroing method is most frequently used.

FIG. 1A is a diagram showing an output buffer 100 which is modeled according to the related art, and FIGS. 1B and 1C are diagrams showing an offset voltage generated in the related art.

The offset voltage, which is generated in the output node A of an output stage in accordance with time after an input voltage signal is applied to an input stage of the output buffer 100 of FIG. 1A, can be divided into a positive offset voltage (FIG. 1B) and a negative offset voltage (FIG. 1C). The positive offset voltage is generated because an output voltage is larger than an input voltage, and the negative offset voltage is generated because an input voltage is larger than an output voltage. Such an offset voltage prevents an image signal from being accurately transmitted during a data transmission time t. The offset voltage is generated by various causes. As the main cause, the mismatch between transistors which occurs in a process of manufacturing semiconductor circuits can be exemplified. That is, the positive or negative offset voltage is generated when signal-path transistors, which process a main signal and sub signal of a semiconductor circuit input stage, are manufactured to have a different size in the process of manufacturing semiconductor circuits.

FIG. 2 is a circuit diagram showing a conventional output buffer 200, to which an offset compensating circuit using the auto zeroing method is applied.

As shown in FIG. 2, the conventional output buffer circuit 200 is composed of an input stage (201a to 201f) of which one end receives an input voltage and the other end receives an output voltage, a floating current source (202a to 202d) which biases a class AB output stage (204a and 204b), a summing circuit (203a to 203h) which is connected to the input stage (201a to 201f), the floating current source (202a to 202d), and the class AB output stage (204a and 204b) so as to sum up the current supplied from the input stage (201a to 201f) and the internal current supplied from the floating current source (202a to 202d), the class AB output stage (204a and 204b) which, when the difference between the input and output voltages is larger than 0, increases a current flowing in the output stage so as to output a voltage, and an offset compensating circuit which is connected to the input stage (201a to 201f) and the class AB output stage (204a and 204b) and is composed of switches and a capacitor so as to compensate the offset voltage.

The offset compensating circuit is composed of a capacitor Coff which stores an offset voltage and switches SW1 to SW4 which, when an offset voltage is generated, are complementarily turned on so as to compensate the offset voltage.

The operation in which an offset voltage is compensated by the offset compensating circuit is divided in two steps. Referring to the buffer circuit 200 shown in FIG. 2, the operation in which the offset voltage is compensated will be described.

Here, the offset voltage of the output buffer circuit 200 itself is referred to as Voff and an input voltage is referred to as Vin. In the first step, the first and second switches SW1 and SW2 are turned on and the third and fourth switches SW3 and SW4 are turned off, so that the offset voltage Voff of the output buffer circuit 200 is stored in the capacitor Coff. That is, since the first and second switches SW1 and SW2 are turned on, the voltage of the minus (−) node of the capacitor Coff becomes Vin and the voltage of the plus (+) node of the capacitor Coff becomes Vin+Voff. Accordingly, a voltage which is applied to both ends of the capacitor becomes Voff.

The offset voltage Voff stored in the capacitor Coff is compensated in the second step when the third and fourth switches SW3 and SW4 are turned on and the first and second switches SW1 and SW2 are turned off. That is, if the third and fourth switches SW3 and SW4 are turned on, the voltage at the plus (+) node of the capacitor is converted into Vin, and the voltage at the minus (−) node of the capacitor becomes Vin−Voff in accordance with the principle of conservation of charge. Accordingly, a voltage which is applied to the input stage (201a to 201f) of the output buffer circuit 200 becomes Vin−Voff. Since the offset voltage of the output buffer circuit 200 itself is defined as Voff, the offset voltage Voff is compensated so that the output voltage becomes equal to the input voltage Vin.

In the conventional output buffer circuit as described above, however, a time for sampling offset, that is, a time for blocking the signal path of input and output voltages in the first step and for compensating the offset voltage in the second step is required. Therefore, a time required for transmitting data cannot be secured sufficiently, thereby preventing high-rate data transmission.

Further, as the offset voltage is compensated by using a switch, an offset voltage which is different from the actual offset voltage is generated due to the charge injection effect occurring at the time of switching. Then, the perfect compensation of the offset voltage is not carried out.

Furthermore, the offset voltage can be stored in not only the capacitor composing the offset compensating circuit but also a generated parasitic capacitor. Therefore, in order to prevent the resultant error, a capacitor with more than a constant capacitance value is required, so that the size of the output buffer circuit increases.

SUMMARY OF THE INVENTION

An advantage of the present invention is that it provides an output buffer circuit, in which the offset voltage of a data driver is detected through an offset compensating circuit composed of a small number of switching elements and resistances and is fed back to an input stage so that an output voltage becomes equal to an input voltage. Therefore, the data driver can be reduced in size, the offset voltage can be accurately compensated, and data can be transmitted at a high rate because a time for compensating the offset voltage is not required.

Additional aspects and advantages of the present general inventive concept will be set forth in part in the description which follows and, in part, will be obvious from the description, or may be learned by practice of the general inventive concept.

According to an aspect of the invention, an output buffer circuit includes an input stage of which one end receives an input voltage and the other end receives an output voltage; a class AB output stage that increases a current flowing in the output stage when the difference between the input and output voltages is larger than 0; a floating current source that biases the class AB output stage; a summing circuit that is connected to the input stage, the floating current source, and the class AB output stage so as to sum up the current supplied from the input stage and the internal current supplied from the floating current source; and an offset compensating circuit that is connected to the input stage and is composed of a plurality of switching elements and resistors so as to detect an offset voltage to compensate.

The input stage includes a first NMOS transistor of which the gate receives the input voltage; a first PMOS transistor of which the gate receives the input voltage; a second NMOS transistor of which the gate receives the output voltage; a second PMOS transistor of which the gate receives the output voltage; a third NMOS transistor that biases the first and second NMOS transistors; and a third PMOS transistor that biases the first and second PMOS transistors.

The offset compensating circuit includes a first resistor that is connected to the first NMOS transistor of the input stage; a second resistor that is connected to the second NMOS transistor of the input stage; a third resistor that is connected to the first PMOS transistor of the input stage; a fourth resistor that is connected to the second PMOS transistor of the input stage; a first switching element that is connected to the first resistor; a second switching element that is connected to the second resistor; a third switching element that is connected to the third resistor; and a fourth switching element that is connected to the fourth resistor.

When the input voltage is applied so that the output voltage is output, the first and second switching elements are connected so that a power supply voltage is applied to the first and second resistors, and the third and fourth switching elements are connected so that a ground voltage is applied to the third and fourth resistors.

When the generated offset voltage is compensated, the first and third switching elements are connected so that the output voltage is applied to the first and third resistors, and the second and fourth switching elements are connected so that the input voltage is applied to the second and fourth resistors.

The offset voltage is a positive offset voltage.

The current value of the first NMOS transistor is smaller than that of the second NMOS transistor, and the current value of the first PMOS transistor is larger than that of the second PMOS transistor.

The current value of the first resistor is larger than that of the second resistor, and the current value of the third resistor is smaller than that of the fourth resistor.

The offset voltage is a negative offset voltage.

The current value of the first NMOS transistor is larger than that of the second NMOS transistor, and the current value of the first PMOS transistor is smaller than that of the second PMOS transistor.

The current value of the first resistor is smaller than that of the second resistor, and the current value of the third resistor is larger than that of the fourth resistor.

The sum of the current values of the first NMOS transistor and the first resistor is equal to the sum of the current values of the second NMOS transistor and the second resistor, and the sum of the current values of the first PMOS transistor and the third resistor is equal to the sum of the current values of the second PMOS transistor and the fourth resistor.

The first and second resistors are NMOS transistors, and the third and fourth resistors are PMOS transistors.

The first to fourth switching elements are transistors.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1A is a diagram showing an output buffer which is modeled according to the related art;

FIG. 1B is a diagram showing a positive offset voltage which is generated in the related art;

FIG. 1C is a diagram showing a positive offset voltage which is generated in the related art;

FIG. 2 is a circuit diagram showing the output buffer circuit according to the related art;

FIG. 3 is a circuit diagram showing a buffer circuit according to the present invention;

FIG. 4A is a diagram showing the operation timing of the output buffer circuit according to the present invention which compensates a positive offset voltage; and FIG. 4B is a diagram showing the operation timing of the output buffer circuit according to the present invention which compensates a negative offset voltage.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

FIG. 3 is a circuit diagram showing an output buffer circuit 300 according to the present invention.

As shown in FIG. 3, the output buffer circuit 300 is composed of an input stage (301a to 301f) of which one end receives an input voltage and the other end receives an output voltage, a floating current source (302a to 302d) which biases a class AB output stage (304 and 304b), a summing circuit (303a to 303h) which is connected to the input stage (301a to 301∅), the floating current source (302a to 302d), and the class AB output stage (304a to 304b) so as to sum up the current supplied from the input stage (301a to 301f) and the internal current supplied from the floating current source (302a to 302d), the class AB output stage (304a and 304b) which, when the difference between the input and output voltages is larger than 0, increases a current flowing in the output stage so as to output a voltage, and an offset compensating circuit (305a to 305h) which is composed of a plurality of switching elements and resistors and detects an offset voltage to compensate.

The input stage (301a to 301f) is composed of a first NMOS transistor 301a and first PMOS transistor 301c of which the gate receives the input voltage, a second NMOS transistor 301b and second PMOS transistor 301d of which the gate receives the output voltage, a third NMOS transistor 301e which biases the first and second NMOS transistors 301a and 301b, and a third PMOS transistor 301f which biases the first and second PMOS transistors 301c and 301d. Since the input stage (301a to 301f is composed of NMOS transistors and PMOS transistors as shown in FIG. 3, all ranges of voltages from a ground voltage to a power supply voltage VDD can be secured as input and output voltages. Such an input stage that can secure all the ranges of voltages from a ground voltage to a power supply voltage VDD as input and output voltages is referred to as a rail to rail input stage. Therefore, as the output buffer according to the invention, a folded-cascode operational amplifier provided with the rail to rail input stage is preferably used.

The offset compensating circuit (305a to 305h) are composed of a first resistor 305a which is connected to the first NMOS transistor 301a of the input stage (301a to 301f, a second resistor 305b which is connected to the second NMOS transistor 301b of the input stage (301a to 301f), a third resistor 305c which is connected to the first PMOS transistor 301c of the input stage (301a to 301f), a fourth resistor 305d which is connected to the second PMOS transistor 301d of the input stage (301a to 301f), a first switching element 305e which connects an output voltage or power supply voltage to the first resistor 305a, a second switching element 305f which connects an input voltage or power supply voltage to the second resistor 305b, a third switching element 305g which connects an output voltage or ground voltage to the third resistor 305c, and a fourth switching element 305h which connects an input voltage or ground voltage to the fourth resistor 305h.

The first and second resistors 305a and 305b are NMOS transistors, and the third and fourth resistors 305c and 305d are PMOS transistors. The first to fourth switching elements 305e to 305h are composed of transistors.

When each resistance value of the first and second resistors implemented of NMOS transistors and each resistance value of the third and fourth resistors implemented of PMOS transistors are set to Rin, a gate-to-source voltage of the NMOS transistor is set to $V_{GS}$, a source-to-gate voltage of the PMOS transistor is set to $V_{SG}$, and a threshold voltage of the NMOS and PMOS transistors is set to $V_{TH}$, the resistance values of the first to fourth resistors are as follows.

$Rin=1/\beta(V_{GS}-V_{TH})$ (the first and second resistors)   Expression 1

$Rin=1/\beta(V_{SG}-|V_{TH}|)$ (the third and fourth resistors)   Expression 2

Hereinafter, preferred embodiments will be described in detail, in which a generated offset voltage is detected and compensated by using the output buffer circuit 300 shown in FIG. 3.

First Embodiment

FIG. 4A is a diagram showing the operation timing of an output buffer circuit, which compensates for a positive offset voltage+Voff, according to the present invention.

As shown in FIG. 4A, the operation timing of the output buffer circuit according to the invention can be roughly divided into a first interval, where an input voltage Vin is applied so that an output voltage including a positive offset voltage +Voff is output, and a second interval where the positive offset voltage +Voff generated by the mismatch between transistors is compensated.

First, the operation of the output buffer circuit in the first interval is as follows.

In the first interval, all the first to fourth switching elements 305e to 305h of the offset compensating circuit (305a to 305h) are connected to a power supply voltage VDD and a ground voltage so that all the first to fourth resistors 305a to 305d of the offset compensating circuit (305a to 305h) are separated from the input voltage Vin and output voltage Vout, as shown in FIGS. 3 and 4A.

In other words, the first and second switching elements 305e and 305f are connected so that a power supply voltage VDD is applied to the first and second resistors 305a and 305b implemented of NMOS transistors. The third and fourth switching elements 305g and 305h are connected so that a ground voltage is applied to the third and fourth resistors 305c and 305d implemented of PMOS transistors. Accordingly, since the gate-to-source voltage $V_{GS}$ or source-to-gate voltage $V_{SG}$ of the first to fourth resistors 305a to 305d of the offset compensating circuit (305a to 305h) becomes the maximum, the resistance value of the first to fourth resistors 305a to 305b becomes the minimum by means of Expressions 1 and 2. Further, the resistance value is constantly maintained. Therefore, the output voltage Vout increases or decreases while maintaining a constant slope.

When a positive offset voltage +Voff is generated, a process in which the positive offset voltage +Voff is compensated in the second interval will be described as follows.

A case where the positive offset voltage +Voff is compensated when the NMOS transistors 301a, 301b, and 301e of the input stage (301a to 301f) operate will be first described.

Since the positive offset voltage +Voff is generated when the input voltage Vin is larger than the output voltage Vout, the gate voltage of the first NMOS transistor 301a becomes smaller than the gate voltage of the second NMOS transistor 301b. Accordingly, the current value of the first NMOS transistor 301a becomes smaller (as much as the magnitude of the offset voltage +Voff) than that of the second NMOS transistor 301b.

At this time, the first switching element 305e is connected so that the output voltage Vout is applied to the gate of the first resistor 305a, and the second switching element 305f is connected so that the input voltage Vin is applied to the gate of the second resistor 305b. Then, the gate voltage of the first resistor 305a becomes larger than the gate voltage of the second resistor 305b.

Accordingly, the gate-to-source voltage $V_{GS}$ of the first resistor 305a becomes larger than the gate-to-source voltage $V_{GS}$ of the second resistor 305b. Then, since the resistance value of the first resistor 305a becomes smaller than that of the second resistor 305b by means of Expression 1, the current value of the first resistor 305a becomes larger (as much as the magnitude of the offset voltage +Voff) than the current value of the second resistor 305b.

Then, the same magnitude of current flows from the drains of the fourth and fifth PMOS transistors 303a and 303b of the summing circuit (303a to 303h) into the drains of the first and second NMOS transistors 301a and 301b of the input stage (301a to 301f). Therefore, the output voltage Vout decreases, so that the positive offset voltage +Voff converges to 0.

A case where the positive offset voltage +Voff is compensated when the PMOS transistors 301c, 301d, and 301f of the input stage (301a to 301f) operate will be described.

When a positive offset voltage +Voff is generated, the gate voltage of the first PMOS transistor 301c becomes smaller than the gate voltage of the second PMOS transistor 301d. Accordingly, the current value of the first PMOS transistor 301c becomes larger (as much as the magnitude of the offset voltage +Voff) than the current value of the second PMOS transistor 301d.

At this time, the third switching element 305g is connected so that the output voltage Vout is applied to the gate of the third resistor 305c, and the fourth switching element 305h is connected so that the input voltage Vin is applied to the gate of the fourth resistor 305d. The gate voltage of the third resistor 305c becomes larger than the gate voltage of the fourth resistor 305d.

Accordingly, the source-to-gate voltage $V_{SG}$ of the third resistor 305c becomes smaller than the source-to-gate voltage $V_{SG}$ of the fourth resistor 305d. Then, since the resistance value of the third resistor 305c becomes larger than the resistance value of the fourth resistor 305d by means of Expression 2, the current value of the third resistor 305c becomes smaller (as much as the magnitude of the offset voltage +Voff) than the current value of the fourth resistor 305d.

As a result, the same magnitude of current flows from the drains of the fourth and fifth NMOS transistors 303c and 303d of the summing circuit (303a to 303h) into the drains of the first and second PMOS transistors 301c and 301d of the input stage (310a to 301f). Therefore, the output voltage Vout decreases so that the positive offset voltage +Voff converges to 0.

Second Embodiment

FIG. 4B is a diagram showing the operation timing of an output buffer circuit which compensates for a negative offset voltage −Voff according to the present invention.

As shown in FIG. 4B, the operation timing of the output buffer circuit can be roughly divided into a first interval, where an input voltage Vin is applied so that an output voltage including a negative offset voltage −Voff is output, and a second interval where the negative offset voltage −Voff generated by the mismatch between transistors is compensated, similar to the first embodiment.

First, the operation of the output buffer circuit in the first interval will be described as follows.

In the first interval, all the first to fourth switching elements 305e to 305h of the offset compensating circuit (305a to 305h) are connected to a power supply voltage VDD and ground voltage so that the first to fourth resistors 305a to 305d of the offset compensating circuit (305a to 305h) are separated from the input voltage Vin and output voltage Vout, similar to the first embodiment.

The first and second switching elements 305e and 305f are connected so that a power supply voltage VDD is applied to the first and second resistors 305a and 305b implemented of NMOS transistors. The third and fourth switching elements 305g and 305h are connected so that a ground voltage is applied to the third and fourth resistors 305c and 305d implemented of PMOS transistors. Accordingly, since the gate-to-source voltage $V_{GS}$ or the source-to-gate voltage $V_{SG}$ of the first to fourth resistors 305a to 305d of the offset compensating circuit (305a to 305h) becomes the maximum, and the resistance value of the first to fourth resistors 305a to 305d becomes the minimum by means of Expressions 1 and 2. Further, the resistance value is constantly maintained. Then, the output voltage Vout increases or decreases while maintaining a constant slope.

When a negative offset voltage −Voff is generated, a process in which the negative offset voltage −Voff is compensated in the second interval will be as follows.

A case will be first described, where the negative offset voltage −Voff is compensated when the NMOS transistors 301a, 301b, and 301e of the input stage (301a to 301f operate.

Since the negative offset voltage −Voff is generated when the input voltage Vin is larger than the output voltage Vout, the gate voltage of the first NMOS transistor 301a becomes larger than the gate voltage of the second NMOS transistor 301b. Accordingly, the current value of the first NMOS transistor 301a becomes larger (as much as the magnitude of the offset voltage −Voff) than the current value of the second NMOS transistor 301b.

At this time, the first switching element 305e is connected so that the output voltage Vout is applied to the gate of the first resistor 305a, and the second switching element 305f is connected so that the input voltage Vin is applied to the gate of the second resistor 305b. Then, the gate voltage of the first resistor 305a becomes smaller than that of the second resistor 305b.

Therefore, the gate-to-source voltage $V_{GS}$ of the first resistor 305a becomes smaller than the gate-to-source voltage $V_{GS}$ of the second resistor 305b, and the resistance value of the first resistor 305a becomes larger than that of the second resistor 305b by means of Expression 1. Accordingly, the current value of the first resistor 305a becomes smaller (as much as the magnitude of the offset voltage −Voff) than that of the second resistor 305b.

As a result, the same magnitude of current flows from the drains of the fourth and fifth PMOS transistors 303a and 303b of the summing circuit (303a to 303h) into the drains of the first and second NMOS transistors 301a and 301b of the input stage (301a to 301f). Therefore, the output voltage Vout increases so that a negative offset voltage −Voff converges to 0.

A case where the negative offset voltage −Voff is compensated when the PMOS transistors 301c, 301d, and 301f of the input stage (301a to 301f) operate will be described.

When the negative offset voltage −Voff is generated, the gate voltage of the first PMOS transistor 301c becomes larger than that of the second PMOS transistor 301d. Then, the current value of the first PMOS transistor 301c becomes smaller (as much as the offset voltage −Voff) than that of the second PMOS transistor 301d.

At this time, the third switching element 305g is connected so that the output voltage Vout is applied to the gate of the third resistor 305c, and the fourth switching element 305h is connected so that the input voltage Vin is applied to the gate of the fourth resistor 305d. Then, the gate voltage of the third resistor 305c becomes smaller than that of the fourth resistor 305d.

Therefore, the source-to-gate voltage of the third resistor 305c becomes larger than that of the fourth resistor 305d, and the resistance value of the third resistor 305c becomes smaller than the resistance value of the fourth resistor 305d by means of Expression 2. Accordingly, the current value of the third resistor 305c becomes larger (as much as the magnitude of the offset voltage −Voff) than that of the fourth resistor 305d.

As a result, the same magnitude of current flows from the drains of the fourth and fifth NMOS transistors 303c and 303d of the summing circuit (303a to 303h) into the drains of the first and second PMOS transistors 301c and 301d of the input state (301a to 301f. Therefore, the output voltage Vout increases so that the negative offset voltage −Voff converges to 0.

According to the output buffer circuit of the present invention, the offset voltage of a data driver is detected by the offset compensating circuit composed of a smaller number of switching elements and resistors and is again fed back to the input stage so that the output voltage becomes equal to the input voltage. Therefore, a time for compensating the offset voltage is not required, and a lot of time required for data transmission can be accordingly secured, which makes it possible to perform data transmission at a high rate.

Further, as the offset voltage is compensated through consecutive operations of the offset compensating circuit, an error caused by the current injection effect is not generated any more. Accordingly, the offset voltage is perfectly compensated.

Furthermore, as a small number of switching elements and resistors implemented of transistors are used instead of capacitors occupying a large area of the output buffer circuit, the output buffer circuit can be reduced in size, which makes it possible to reduce a material cost.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An output buffer circuit, comprising:
   an input stage of which one end receives an input voltage and the other end receives an output voltage;
   a class AB output stage that increases a current flowing in the output stage when the difference between the input and output voltages is larger than 0;
   a floating current source that biases the class AB output stage;
   a summing circuit that is connected to the input stage, the floating current source, and the class AB output stage so as to sum up the current supplied from the input stage and an internal current supplied from the floating current source; and
   an offset compensating circuit that is connected to the input stage and comprises a plurality of switching elements and resistors so as to detect an offset voltage to be compensated;
   wherein the input stage includes:
   a first NMOS transistor of which the gate receives the input voltage;
   a first PMOS transistor of which the gate receives the input voltage;
   a second NMOS transistor of which the gate receives the output voltage;
   a second PMOS transistor of which the gate receives the output voltage;
   a third NMOS transistor that biases the first and second NMOS transistors; and
   a third PMOS transistor that biases the first and second PMOS transistors.

2. The output buffer circuit according to claim 1, wherein the offset compensating circuit includes:
   a first resistor that is connected to the first NMOS transistor of the input stage;
   a second resistor that is connected to the second NMOS transistor of the input stage;
   a third resistor that is connected to the first PMOS transistor of the input stage;
   a fourth resistor that is connected to the second PMOS transistor of the input stage;
   a first switching element that is connected to the first resistor;
   a second switching element that is connected to the second resistor;
   a third switching element that is connected to the third resistor; and
   a fourth switching element that is connected to the fourth resistor.

3. The output buffer circuit according to claim 2, wherein, when the input voltage is applied so that an output voltage is output, the first and second switching elements are connected so that a power supply voltage is applied to the first and second resistors, and the third and fourth switching elements are connected so that a ground voltage is applied to the third and fourth resistors.

4. The output buffer circuit according to claim 3, wherein the first to fourth switching elements are transistors.

5. The output buffer circuit according to claim 2, wherein, when the generated offset voltage is compensated, the first and third switching elements are connected so that the output voltage is applied to the first and third resistors, and the second and fourth switching elements are connected so that the input voltage is applied to the second and fourth resistors.

6. The output buffer circuit according to claim 5, wherein the offset voltage is a positive offset voltage.

7. The output buffer circuit according to claim 6, wherein the current value of the first NMOS transistor is smaller than that of the second NMOS transistor, and the current value of the first PMOS transistor is larger than that of the second PMOS transistor.

8. The output buffer circuit according to claim 7, wherein the current value of the first resistor is larger than that of the second resistor, and the current value of the third resistor is smaller than that of the fourth resistor.

9. The output buffer circuit according to claim 8, wherein the sum of the current values of the first NMOS transistor and the first resistor is equal to the sum of the current values of the second NMOS transistor and the second resistor, and the sum of the current values of the first PMOS transistor and the third resistor is equal to the sum of the current values of the second PMOS transistor and the fourth resistor.

10. The output buffer circuit according to claim 9, wherein the first and second resistors are NMOS transistors, and the third and fourth resistors are PMOS transistors.

11. The output buffer circuit according to claim 5, wherein the offset voltage is a negative offset voltage.

12. The output buffer circuit according to claim 11, wherein the current value of the first NMOS transistor is larger than that of the second NMOS transistor, and the current value of the first PMOS transistor is smaller than that of the second PMOS transistor.

13. The output buffer circuit according to claim 12, wherein the current value of the first resistor is smaller than that of the second resistor, and the current value of the third resistor is larger than that of the fourth resistor.

* * * * *